(12) United States Patent
Lim

(10) Patent No.: US 11,982,686 B2
(45) Date of Patent: May 14, 2024

(54) ELECTRODE LEAD GRIPPER FOR PRESSURE ACTIVATION DEVICE

(71) Applicant: APRO CO., LTD, Gunpo-si (KR)

(72) Inventor: Jong Hyun Lim, Gunpo-si (KR)

(73) Assignee: APRO CO., LTD, Gunpo-si (KR)

( * ) Notice: Subject to any disclaimer, the term of this patent is extended or adjusted under 35 U.S.C. 154(b) by 210 days.

(21) Appl. No.: 17/790,740

(22) PCT Filed: Feb. 18, 2020

(86) PCT No.: PCT/KR2020/002286
§ 371 (c)(1),
(2) Date: Jul. 4, 2022

(87) PCT Pub. No.: WO2021/153841
PCT Pub. Date: Aug. 5, 2021

(65) Prior Publication Data
US 2023/0042766 A1    Feb. 9, 2023

(30) Foreign Application Priority Data

Jan. 30, 2020  (KR) ........................ 10-2020-0010810

(51) Int. Cl.
*G01R 1/04* (2006.01)
*H01M 4/04* (2006.01)
(Continued)

(52) U.S. Cl.
CPC ........ *G01R 1/0416* (2013.01); *H01M 4/0447* (2013.01); *H01M 10/0481* (2013.01); *H01M 50/553* (2021.01)

(58) Field of Classification Search
CPC ............... G01R 1/0416; G01R 31/364; G01R 31/3644; G01R 31/378; H01M 4/0447;
(Continued)

(56) References Cited

U.S. PATENT DOCUMENTS

2015/0061596 A1* 3/2015 Park .................. H02J 7/0042
320/113
2017/0110760 A1* 4/2017 Hatta .................. B60L 58/14

FOREIGN PATENT DOCUMENTS

JP    2015005331 A  *  1/2015  ............. Y02P 70/50
KR    20-0389130 Y1      7/2005
(Continued)

OTHER PUBLICATIONS

International Search Report for PCT/KR2020/002286 mailed Oct. 27, 2020 from Korean Intellectual Property Office.

*Primary Examiner* — Tung X Nguyen
*Assistant Examiner* — Robert P Alejnikov, Jr.
(74) *Attorney, Agent, or Firm* — Revolution IP, PLLC

(57) ABSTRACT

Disclosed is an electrode lead gripper for a pressure activation device, and, in particular, an electrode lead gripper for a pressure activation device in which a current electrode terminal is configured to be stacked and mounted onto an electrode terminal base separately from a voltage electrode terminal and thus improved in contact reliability and increased in contact area in terms of contact with an electrode lead of a pouch type battery cell, thereby having advantages of decreasing contact resistance, reducing the amount of heat generated during charging/discharging, and resulting in further enhancing a charging/discharging efficiency.

4 Claims, 6 Drawing Sheets

(51) Int. Cl.
*H01M 10/04* (2006.01)
*H01M 50/553* (2021.01)

(58) Field of Classification Search
CPC .......... H01M 10/0481; H01M 50/553; H01M 50/548; H01M 50/569; H01M 50/178; H01M 10/049; H01M 10/446; H01M 50/116; H01M 50/211; Y02E 60/10; Y02P 70/50
USPC .................................................... 324/754.11
See application file for complete search history.

(56) References Cited

FOREIGN PATENT DOCUMENTS

| | | | | | |
|---|---|---|---|---|---|
| KR | 200389130 | Y1 | * | 7/2005 | ........ H01M 10/4242 |
| KR | 10-2011-0004007 | A | | 1/2011 | |
| KR | 10-2015-0011861 | A | | 2/2015 | |
| KR | 10-2015-0025419 | A | | 3/2015 | |
| KR | 2015050220 | A | * | 5/2015 | .......... H01M 2/1027 |
| KR | 20160050024 | A | * | 5/2016 | ........ H01M 10/0568 |
| KR | 10-2017-0068145 | A | | 6/2017 | |
| KR | 20190055595 | A | * | 5/2019 | ............ H01M 2/364 |

\* cited by examiner

[FIG.1]
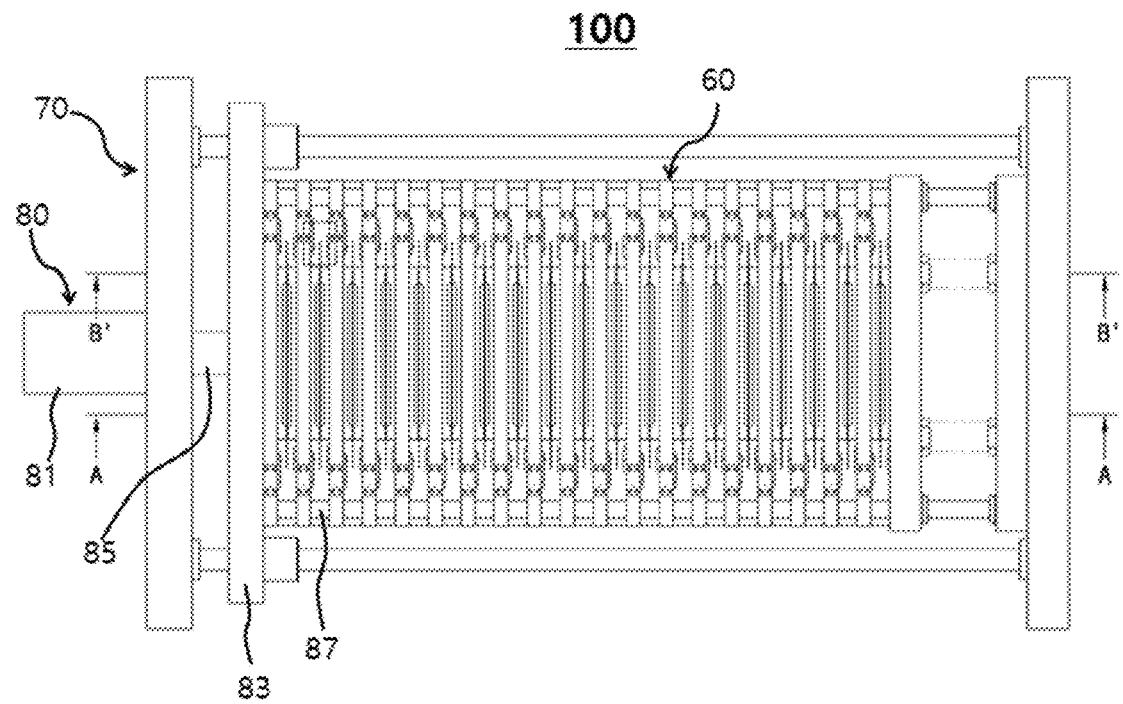
[FIG.2]
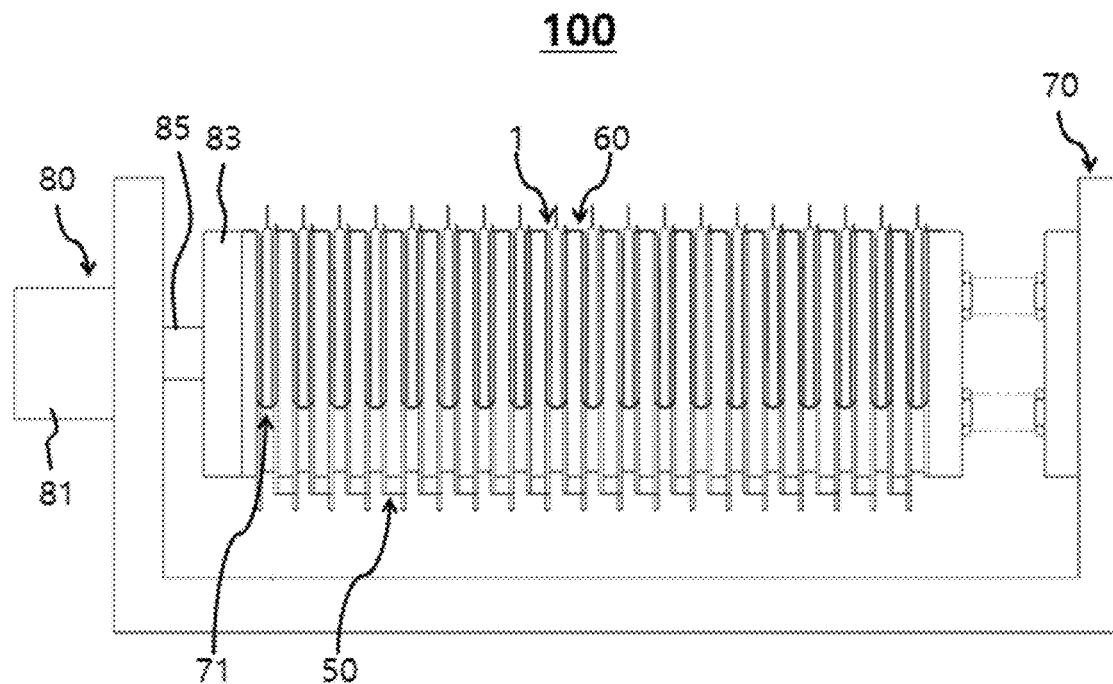

[FIG.3]
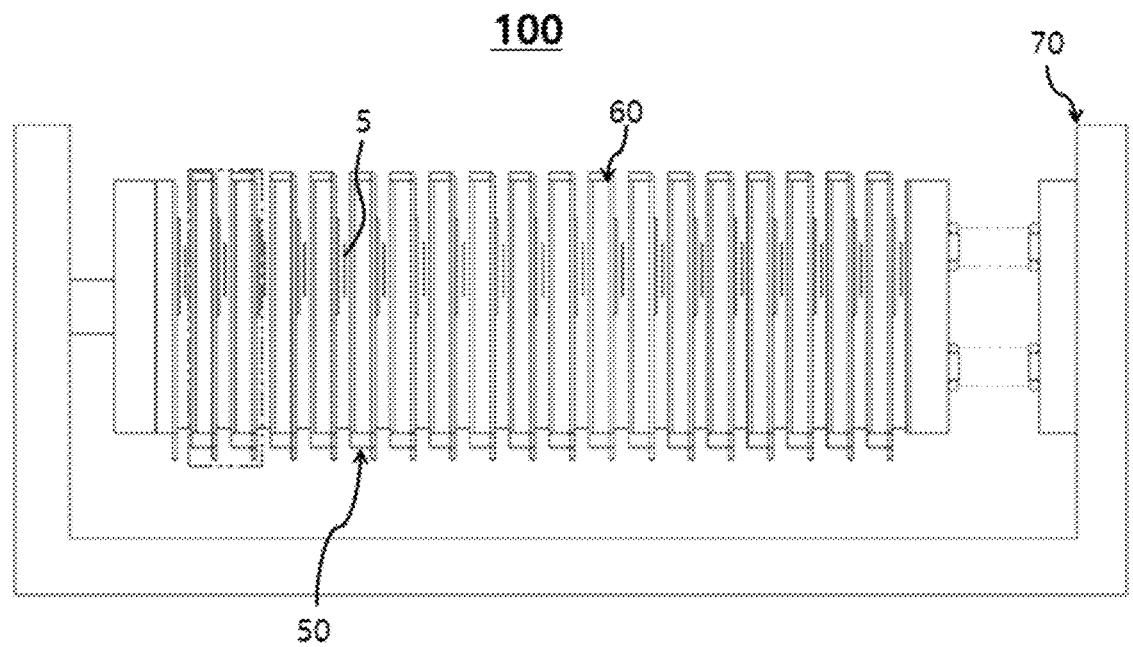
[FIG.4]
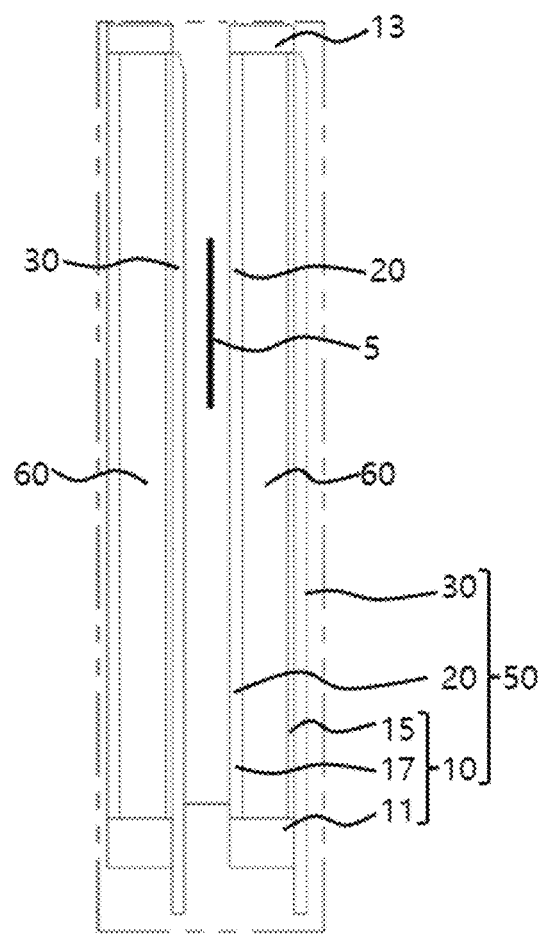

[FIG.5]
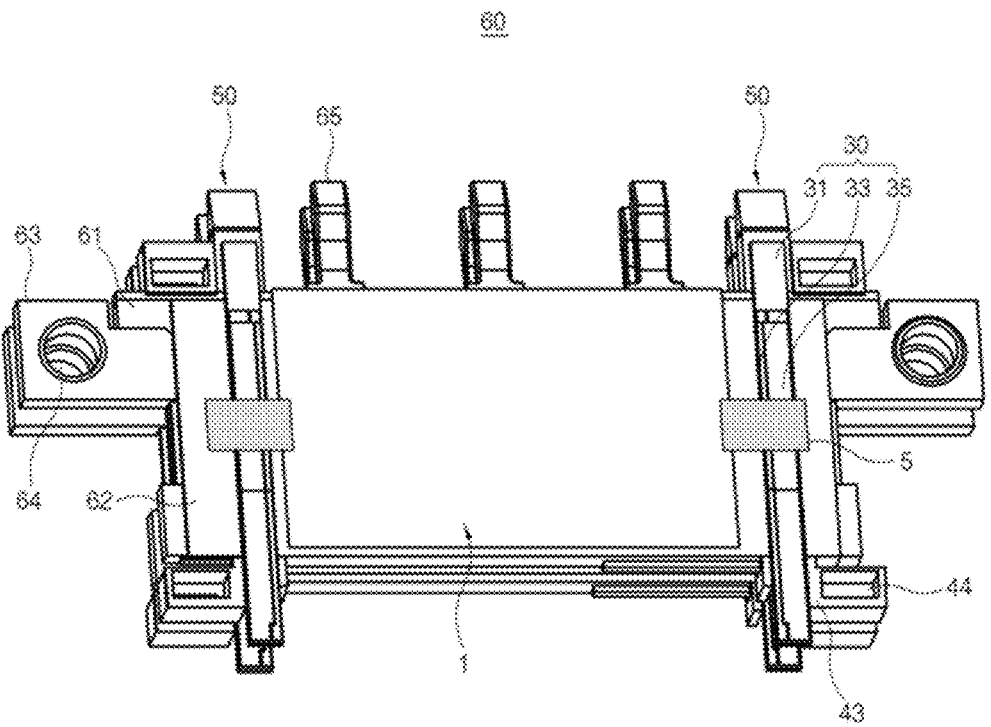
[FIG.6]
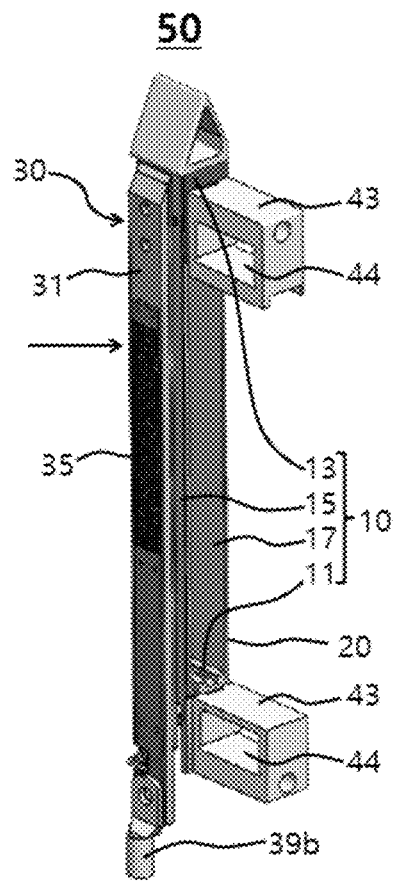

[FIG.7]
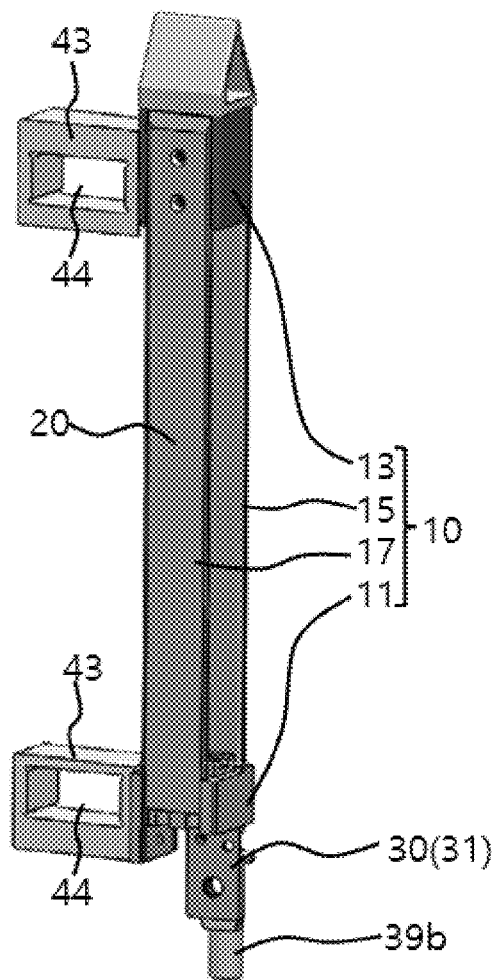

[FIG.8]
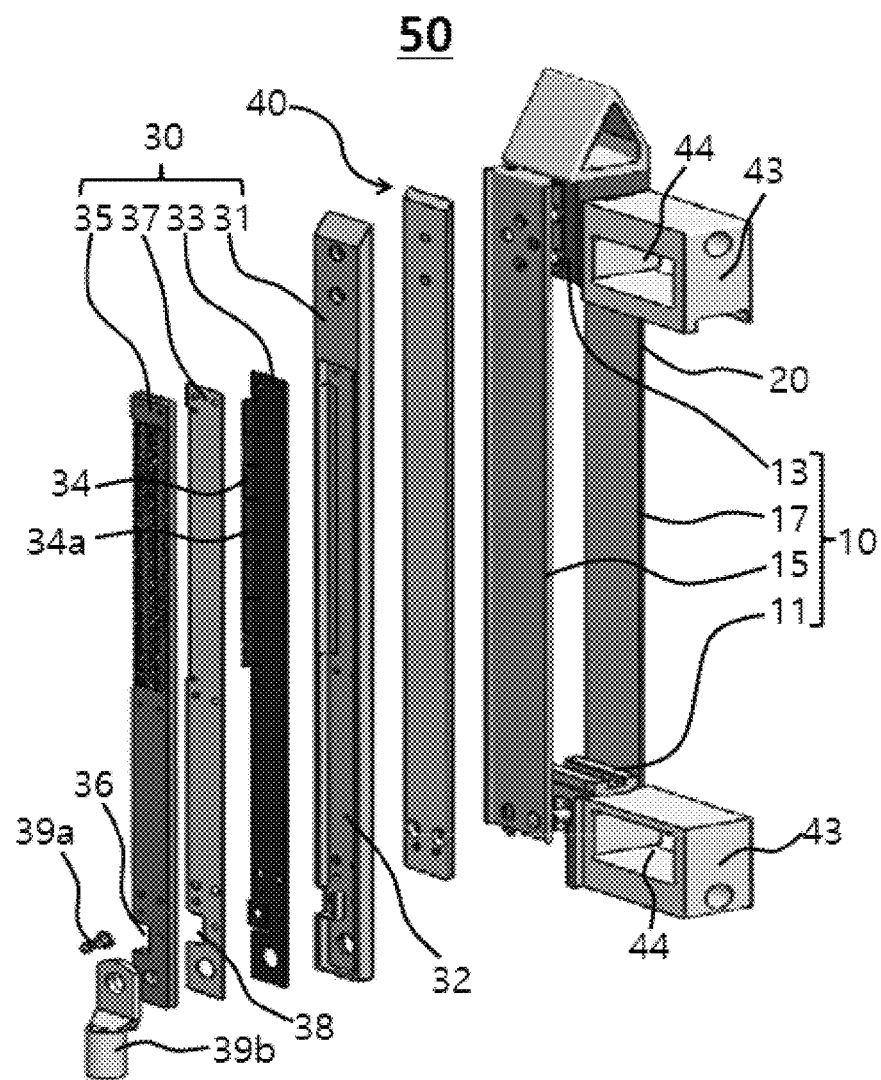

[FIG.9]
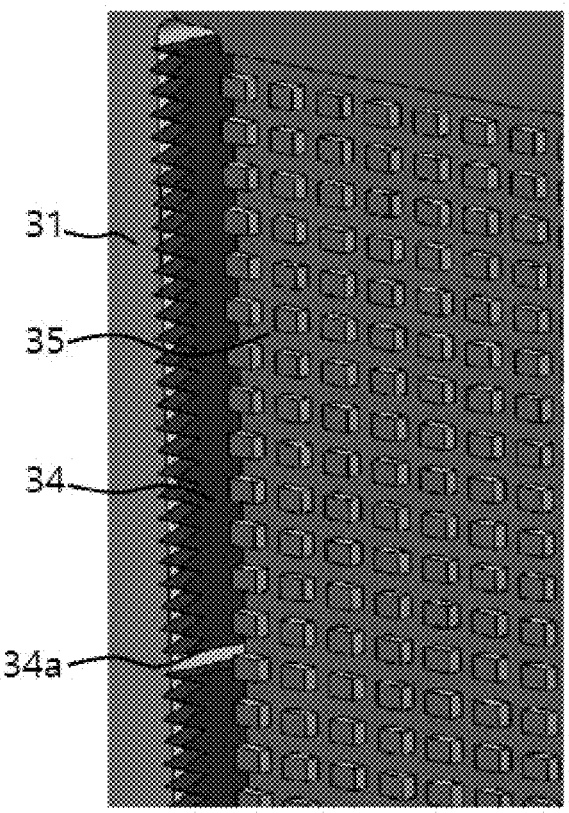
[FIG.10]
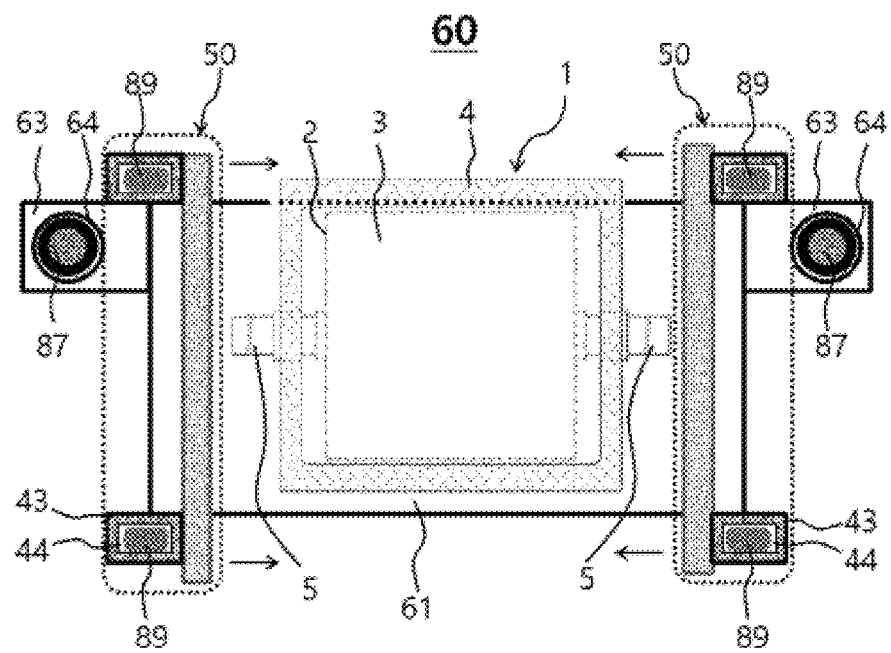

ELECTRODE LEAD GRIPPER FOR PRESSURE ACTIVATION DEVICE

TECHNICAL FIELD

The disclosure relates to an electrode lead gripper for a pressure activation device, and more particularly to an electrode lead gripper for a pressure activation device, in which a current electrode terminal is stacked and mounted onto an electrode terminal base separately from a voltage electrode terminal and thus improved in contact reliability and increased in contact area in terms of contact with an electrode lead of a pouch type battery cell, thereby decreasing contact resistance, reducing the amount of heat generated during charging/discharging, and further enhancing a charging/discharging efficiency.

BACKGROUND ART

With the rapid development of electric, electronic, communication, and computer industries, a demand for high-performance and high-safety batteries has recently been gradually increased. In particular, a demand for small and thin batteries has recently been increased day by day as trends in making electric device small, thin and lightweight are rapidly spreading. To meet such demands, lithium secondary batteries with high energy density has recently attracted the most attention.

The lithium secondary batteries have advantages of long life and high capacities, and thus have recently been widely used in portable electronic devices. The lithium secondary batteries are classified into a lithium metal battery and a lithium-ion battery, which use a liquid electrolyte, and a lithium polymer battery, which uses a polymer solid battery, etc. according to the types of electrolytes. Further, the lithium secondary batteries are classified into a prismatic battery using a prismatic can, a cylindrical battery using a cylindrical can, and a pouch type battery using a pouch according to the types of exteriors for sealing an electrode assembly.

Among them, the pouch type battery has recently been actively developed because of many advantages in that the energy density per unit weight and volume is high, the battery can be made thin and lightweight, the material costs of the exterior are reduced, etc.

Such a pouch type battery is manufactured as follows. First, a cathode plate and an anode plate are manufactured, and then stacked with a separator interposed therebetween, thereby completing an electrode assembly. The electrode assembly is placed inside a pouch case and electrically connects with an electrode lead, and the electrode lead is formed to protrude outwards from the pouch case. After placing the electrode assembly inside the pouch case, an electrolyte is injected into the pouch so that the electrode assembly can be impregnated with the electrolyte. After the injection of the electrolyte, the pouch is sealed by thermally fusing the edges of the pouch.

The pouch type battery completely assembled as above is subjected to a pressure activation process (or a pre-formation process) for pressing the pouch to be activated so that the electrolyte filled in the pouch can be uniformly spread out, an aging process for stabilizing the battery, and a charging/discharging process (or a formation process) for activating the battery.

In the case of a pouch type battery, the pouch case may become convex when the electrolyte is filled in the pouch case, i.e., when the pouch case is filled with the electrolyte during the electrolyte impregnation. The electrolyte needs to be evenly distributed inside the pouch case so as to increase the capacity of the pouch type battery cell. Therefore, a process for pressing the pouch case at a constant temperature in order to evenly spread out the electrolyte filled inside the pouch case is required. To this end, a pressure activation device for pressing and activating the pouch type battery cell is used.

Conventionally, a general pressure activation device performs only a process of pressing the pouch type battery cell, and then charging/discharging and voltage measurement for the pouch type battery cells are separately performed by additional processes, thereby causing a problem that a process efficiency is lowered.

To solve such a problem, Korean Patent Publication No. 10-2017-0068145 (hereinafter, referred to as the "related art") has disclosed a pressing tray which can increase an electrolyte impregnation efficiency in the battery cells, and perform the charging/discharging and the voltage measurement at the same time when the battery cells are pressed.

However, the related art discloses only that a pressing unit includes a contact terminal for contact with the electrode lead of the battery cell when each battery cell is pressed by the pressing unit, but does not specifically suggest an efficient coupling and placing structure for the pressing unit, an efficient contact structure for pressing and supporting the electrode lead of the battery cell, and the arrangement and configuration of a current electrode terminal and a voltage electrode terminal to perform the charging/discharging and the voltage measurement for the battery cells.

DISCLOSURE

Technical Problem

An aspect of the disclosure is to provide an electrode lead gripper for a pressure activation device, and a pressure jig including the same, in which a current electrode terminal is stacked and mounted onto an electrode terminal base separately from a voltage electrode terminal and thus improved in contact reliability and increased in contact area in terms of contact with an electrode lead of a pouch type battery cell, thereby decreasing contact resistance, reducing the amount of heat generated during charging/discharging, and further enhancing a charging/discharging efficiency.

Technical Solution

According to an embodiment of the disclosure, there is provided an electrode lead gripper for a pressure activation device, including: a mounting frame mounted to a pressure plate for pressing a pouch type battery cell; a supporting plate coupled to a second side of the mounting frame, and supporting an electrode lead of the pouch type battery cell to be pressed; and an electrode terminal assembly coupled to a first side of the mounting frame, and pressing and supporting the electrode lead of the pouch type battery cell so that the pouch type battery cell can be charged/discharged, wherein, in a state that the pouch type battery cell is pressed by a pair of adjacent pressure plates, the electrode lead of the pouch type battery cell is elastically pressed and supported between the electrode terminal assembly coupled to the first side of the mounting frame mounted to the pressure plate and the supporting plate coupled to the second side of the mounting frame mounted to an adjacent pressure plate disposed opposite to the pressure plate, and wherein the electrode terminal assembly includes an electrode terminal base made of an insulating material, and a voltage electrode terminal and a current electrode terminal sequentially mounted being overlapped onto the electrode terminal base and stacked being electrically insulated from each other.

Here, the voltage electrode terminal, an insulating plate, and the current electrode terminal may be stacked in sequence and mounted onto the electrode terminal base, the voltage electrode terminal may include a protrusion tension unit bent frontward and protruding from one lateral end thereof, and the protrusion tension unit may protrude further frontward than the current electrode terminal.

Further, the mounting frame may include gripper guides at upper and lower sides thereof to be respectively guided to slide by gripper guide rails provided in the pressure activation device.

Here, the mounting frame may be mounted movably in a lengthwise direction of the pressure plate, and a position at which the mounting frame is mounted to the pressure plate may be adjusted as the gripper guide rail is driven.

Advantageous Effects

In an electrode lead gripper for a pressure activation device according to the disclosure, a current electrode terminal is configured to be stacked and mounted onto an electrode terminal base separately from a voltage electrode terminal and thus improved in contact reliability and increased in contact area in terms of contact with an electrode lead of a pouch type battery cell, thereby having advantages of decreasing contact resistance, reducing the amount of heat generated during charging/discharging, and resulting in further enhancing a charging/discharging efficiency.

DESCRIPTION OF DRAWINGS

FIG. 1 is a plan view of an electrode lead gripper according to an embodiment of the disclosure and a pressure activation device with a pressure jig including the same.

FIG. 2 is a cross sectional view taken along line A-A' of FIG. 1, FIG. 3 is a cross-sectional view taken along line B—B' of FIG. 1, and FIG. 4 is an enlarged view of FIG. 3.

FIG. 5 is a perspective view of a pressure jig including an electrode lead gripper for a pressure activation device according to an embodiment of the disclosure.

FIG. 6 is a perspective view of an electrode lead gripper for a pressure activation device according to an embodiment of the disclosure, viewed from the front.

FIG. 7 is a perspective view of an electrode lead gripper for a pressure activation device according to an embodiment of the disclosure, viewed from the back.

FIG. 8 is an exploded perspective view of an electrode lead gripper for a pressure activation device according to an embodiment of the disclosure.

FIG. 9 is a partially enlarged view, viewed in the arrow direction of FIG. 6.

FIG. 10 is a schematic view for describing position adjustment according to the sizes of pouch type battery cells in an electrode lead gripper for a pressure activation device according to an embodiment of the disclosure.

BEST MODE

An electrode lead gripper 50 for the pressure activation device according to an embodiment of the disclosure is included in a pressure activation device 100 to which the disclosure shown in FIGS. 1 to 4 is applied, and more specifically mounted to a pressure plate of a pressure jig 60 that makes up the pressure activation device 100 and electrically connected to an electrode lead of a pouch type battery cell pressed between the pair of pressure plates, thereby enabling charging/discharging and voltage measurement for the pouch type battery cell.

In other words, the electrode lead gripper 50 for the pressure activation device according to an embodiment of the disclosure may be included in various pressure activation devices configurable with various structures and technical features, and may further be provided in various pressure jigs configurable with various structures and technical features. FIGS. 1 to 4 show the gripper 50 for the pressure activation device according to an embodiment of the disclosure, and the pressure activation device with the pressure jig including the same.

First, the basic configurations and operations of the gripper 50 for the pressure activation device according to an embodiment of the disclosure, and the pressure activation device with the pressure jig including the same are as follows.

As shown in FIGS. 1 to 4, the pressure activation device 100 includes a main body 70 to which a plurality of pouch type battery cells 1 are mounted, the pressure jig 60 interposed between the interfaces of the pouch type battery cells 1, a slip-sheet 71 disposed between the pressure jigs 60 and supporting the pouch type battery cell 1, and a pressure jig driving unit 80 driving the pressure jig 60 to move and press the pouch type battery cell 1, but these elements are basically well-known in the art and thus will be schematically described only to the extent necessary for the disclosure without their detailed descriptions.

The main body 70 forms the outer appearance of the pressure activation device 100, and has a structure for accommodating the plurality of pouch type battery cells 1. The main body 70 may basically include a lower frame, an upper frame, and a pair of connection frames disposed at lateral sides and connecting the lower and upper frames to form a solid shape.

The plurality of pressure jigs 60 may be provided in the main body 70 and disposed between the plurality of pouch type battery cells 1 to face the front and back surfaces of the plurality of pouch type battery cells 1. Here, the plurality of pouch type battery cells 1 may include electrode leads 5 disposed along a lateral direction of the plurality of pressure jigs 60, perpendicular to the forward and backward directions of the main body 70 (i.e., the pressing direction of the pressure jig 60). In other words, the electrode leads 5 of the plurality of pouch type battery cells 1 according to the disclosure may be disposed between the plurality of pressure jigs 60 and protrude in the lateral direction (i.e., the direction perpendicular to the pressing direction).

The pressure jig driving unit 80 may drive the plurality of pressure jigs 60 to slide in the forward and backward direction (i.e., the pressing direction) of the main body 70 so that the plurality of pressure jigs 60 can press the front and back surfaces of the plurality of pouch type battery cells 1 according to the surface directions.

To this end, the pressure jig driving unit 80 may include a driving source 81, a driving plate 83, a driving shaft 85, and a jig guide rail 87. The driving plate 83 may be provided in the main body 70 and face the outermost pressure jig 60 disposed at one side of the plurality of pressure jigs 60.

The driving shaft 85 is connected to the driving plate 83 and driven by the driving source 81 to make the driving plate 83 slide in the forward and backward directions (i.e., the pressing direction) of the main body 70, so that the plurality of pressure jigs 60 can slide in the forward and backward directions (i.e., the pressing direction) of the main body 70.

The jig guide rail 87 may be disposed and fastened between one pair of connection frames of the main body 70 along the forward and backward directions (i.e., the pressing direction) of the main body 70. The jig guide rail 87 may connect with the plurality of pressure jigs 60 and the driving plate 83, thereby guiding the plurality of pressure jigs 60 and the driving plate 83 to slide. As will be described later, the pressure jigs 60 includes a jig guide 63, as shown in FIG. 5, to be guided to slide by the jig guide rail 87.

Although it is not shown in FIGS. 1 to 4, the main body 70 includes a gripper guide rail (see '89' in FIG. 10) provided separately from the jig guide rail 87. In other words, the pressure activation device 100 according to the disclosure may additionally include the gripper guide rail 89, and, specifically, the gripper guide rail 89 is provided between one pair of connection frames of the main body 70 along the forward and backward directions of the main body 70 like the jig guide rail 87.

The gripper guide rail 89 guides the jig guide (see '63' in FIG. 5), which is provided in the electrode lead gripper 50 for the pressure activation device according to the disclosure (to be described later), to slide, so that the electrode lead gripper 50 according to the disclosure can stably slide and move without being separated as the pressure jig 60 slides in the pressing direction. However, unlike the jig guide rail 87, the gripper guide rail 89 according to the disclosure is installed not stationarily but movably in the lateral direction of the pressure jig 60 perpendicular to the pressing direction. The operations of the electrode lead gripper 50 provided in such a pressure activation device and including the gripper guide rail 89 and the jig guide 63 will be described again.

The schematic operations of the pressure activation device 100 with such a configuration are as follows: the pouch type battery cells 1 are inserted between the pressure jigs 60 arrayed at regular intervals in the main body 70, and the inserted pouch type battery cells 1 are supported by the slip-sheet 71 interposed between the pressure jigs 60.

The pressure jig driving unit 80 drives the pressure jigs 60 to press the pouch type battery cells 1 in the state that the pouch type battery cells 1 are inserted as above, and then operates heating pads (see '62' in FIG. 5) provided in the pressure jigs 60 to heat the pressed pouch type battery cells 1. In this case, the electrode lead gripper 50 for the pressure activation device, moved along with the pressure jig 60, elastically comes into contact with the electrode lead 5 of the pouch type battery cell 1. In other words, when the pressure jig 60 moves to press the pouch type battery cell 1, the electrode lead gripper 50 for the pressure activation device, installed in the pressure jig 60, also moves together and elastically comes into contact with the electrode lead 5 of the pouch type battery cell 1.

The pressure activation device 100 schematically described above may include the electrode lead gripper 50 for the pressure activation device according to an embodiment of the disclosure. Specifically, as shown in FIG. 5, the electrode lead grippers 50 for the pressure activation device are placed at both sides of the pressure plate 61 of the pressure jig 60, and moved by the pressure plate 61 as the pressure jig 60 is pressed. With such a pressing operation, the electrode lead 5 of the pouch type battery cell 1 is elastically pressed and supported, thereby enabling the charging/discharging and voltage measurement for the pouch type battery cell 1.

FIG. 5 is a perspective view of the pressure jig including the electrode lead gripper for a pressure activation device according to an embodiment of the disclosure, FIG. 6 is a perspective view of the electrode lead gripper for the pressure activation device according to an embodiment of the disclosure, viewed from the front, FIG. 7 is a perspective view of the electrode lead gripper for the pressure activation device according to an embodiment of the disclosure, viewed from the back, FIG. 8 is an exploded perspective view of the electrode lead gripper for the pressure activation device according to an embodiment of the disclosure, and FIG. 9 is a partially enlarged view, viewed in the arrow direction of FIG. 6.

As shown in FIGS. 5 to 9, the electrode lead gripper 50 for the pressure activation device according to an embodiment of the disclosure includes a mounting frame 10 mounted to the pressure plate 61 for pressing the pouch type battery cell 1, a supporting plate 20 coupled to a second side of the mounting frame 10 and supporting the electrode lead 5 of the pouch type battery cell 1 to be pressed, and an electrode terminal assembly 30 coupled to a first side of the mounting frame 10 and pressing and supporting the electrode lead 5 of the pouch type battery cell 1 so that the pouch type battery cell 1 can be charged and discharged.

The mounting frame 10 may have various shapes as long as it can be mounted to the pressure plate 61. To be easily mounted to and separated from the pressure plate 61, the mounting frame 10 may have a shape for the coupling in the lateral direction of the pressure plate 61.

To this end, the mounting frame 10 according to the disclosure may be configured to have a quadrangular frame shape and be perforated in one direction. Specifically, the mounting frame 10 includes a lower mounting block 11 forming a lower side, an upper mounting block 13 forming an upper side, a first side mounting plate 15 connecting the first sides of the lower mounting block 11 and the upper mounting block 13 in a vertical direction, and a second side mounting plate 17 disposed opposing to the first side mounting plate 15 and connecting the second sides of the lower mounting block 11 and the upper mounting block 13 in the vertical direction.

With this configuration, the mounting frame 10 may be mounted to the pressure plate 61 as fitted to the pressure plate 61 in the lateral direction because it is shaped like a perforated quadrangular frame. Such a shape has an advantage in that the electrode lead gripper 50 according to the disclosure does not need an additional coupling structure for coupling with the pressure jig 60. Of course, the mounting frame 10 may move in the lengthwise direction of the pressure plate 61, and therefore a gripper guide 43 guided to slide by the gripper guide rail 89 may be additionally provided in the mounting frame 10.

Because the mounting frame 10 having the foregoing structure is mounted as put on the pressure plate 61, the first side mounting plate 15 faces toward another pressure plate adjacent in a first direction and the second side mounting plate 17 faces toward another pressure plate adjacent in a second direction.

The supporting plate 20 for supporting the electrode lead 5 of the pouch type battery cell 1 to be pressed is coupled to the second side of the mounting frame 10. In other words, the supporting plate 20 is coupled and mounted to the second side mounting plate 17 of the mounting frame 10. To make a simple structure, the second side mounting plate 17 may serve as the supporting plate 20 as necessary.

The supporting plate 20 may be elastically coupled to the second side mounting plate 17 of the mounting frame 10 in order to elastically support the electrode lead 5 of the pouch type battery cell 1 to be pressed. In other words, the supporting plate 20 may be elastically coupled to the second side mounting plate 17 with an elastic member (not shown) therebetween. Meanwhile, when the second side mounting plate 17 is used as the supporting plate 20, the second side mounting plate 17 may be elastically coupled to each second side of the lower mounting block 11 and the upper mounting block 13.

The electrode terminal assembly 30 is coupled to the first side of the mounting frame 10 so as to press and support the electrode lead 5 of the pouch type battery cell 1 to be pressed, thereby enabling the charging/discharging and the voltage measurement for the pouch type battery cell 1. In other words, the electrode terminal assembly 30 is coupled and mounted to the first side mounting plate 15 of the mounting frame 10.

With this configuration, the electrode lead 5 of the pouch type battery cell 1 to be pressed may be clamped by not a single electrode lead gripper 50 for the pressure activation device, but a pair of electrode lead grippers 50 respectively mounted to the pair of pressure plates 61 disposed adjacent to each other.

Specifically, when the pouch type battery cell 1 is pressed by the pair of adjacent pressure plates 61, the electrode lead 5 of the pouch type battery cell 1 is elastically pressed and supported between the electrode terminal assembly 30 coupled to the first side of the mounting frame 10 mounted to the pressure plate 61 and the supporting plate 20 coupled to the second side of the mounting frame 10 mounted to an adjacent pressure plate 61 disposed opposite to the foregoing pressure plate 61

In the state that the electrode lead 5 of the pouch type battery cell 1 is elastically pressed and supported by the adjacent electrode lead grippers 50, it is possible to perform the charging/discharging and measure the voltage. To this end, the electrode terminal assembly 30 needs to include a voltage electrode terminal 33 and a current electrode terminal 35. According to the disclosure, the electrode terminal assembly 30 is employed and applied to have a structure for increasing the contact area of the current electrode terminal, preventing contact failure and error as elastically pressed and supported, and easily replacing only a damaged or defective electrode terminal or a corresponding part.

To this end, the electrode terminal assembly 30 according to the disclosure includes an electrode terminal base 31 made of an insulating material, and the voltage electrode terminal 33 and the current electrode terminal 35 which are mounted onto the electrode terminal base 31 in the form of being overlapped in sequence but electrically separated from each other.

The electrode terminal base 31 may employ and use various insulating base materials. The voltage electrode terminal 33 and the current electrode terminal 35 are coupled and mounted onto the electrode terminal base 31 by various methods, which are not disposed on the same plane but sequentially overlapped being electrically insulated from each other. In other words, the voltage electrode terminal 33 and the current electrode terminal 35 are stacked and mounted being electrically insulated from each other.

If both the voltage electrode terminal 33 and the current electrode terminal 35 are mounted on the same surface or plane, the two electrode terminals are formed within a given area and therefore the contact area of the current electrode terminal 35 is reduced by the mounting area of the voltage electrode terminal 33. In this case, the contact area of the current electrode terminal 35 to come into contact with the electrode lead 5 of the pouch type battery cell 1 is consequently decreased.

To solve these shortcomings, the electrode terminal assembly 30 according to the disclosure has a structure that the current electrode terminal 35 is not formed on the same plane as the voltage electrode terminal 33 but formed separately from the voltage electrode terminal 33 and stacked being overlapped with the voltage electrode terminal 33. In result, the contact area of the current electrode terminal 35 is sufficiently increased without being affected by the voltage electrode terminal 33.

Thus, the electrode terminal assembly 30, in which the voltage electrode terminal 33 and the current electrode terminal 35 are mounted being sequentially stacked, has a structure that the voltage electrode terminal 33 and the current electrode terminal 35 are sequentially mounted onto the electrode terminal base 31 as being electrically insulated from and overlapped with each other.

MODE FOR INVENTION

The electrode terminal assembly 30 includes the electrode terminal base 31, and includes the voltage electrode terminal 33, an insulating plate 37, and the current electrode terminal 35 which are sequentially stacked, mounted and coupled to the electrode terminal base 31. In other words, the voltage electrode terminal 33, the insulating plate 37, and the current electrode terminal 35 are sequentially stacked and mounted on the electrode terminal base 31.

The electrode terminal base 31 may be made of an insulating material because the voltage electrode terminal 33 is directly mounted and coupled onto the electrode terminal base 31. Further, the electrode terminal base 31 is formed with an electrode terminal mounting groove 32 so that the voltage electrode terminal 33, the insulating plate 37, and the current electrode terminal 35 can be easily mounted and stably maintained thereon. The electrode terminal mounting groove 32 may be formed so that the voltage electrode terminal 33, the insulating plate 37, and the current electrode terminal 35 can be sequentially seated without a gap. In other words, the electrode terminal mounting groove 32 may have a similar shape to and a slightly larger area than the voltage electrode terminal 33, the insulating plate 37, and the current electrode terminal 35.

The voltage electrode terminal 33 is first mounted to the electrode terminal mounting groove 32. The voltage electrode terminal 33 is basically shaped like a flat plate, and includes a protrusion tension unit 34 protruding from one lateral end thereof so as to come into contact with the electrode lead 5 of the pouch type battery cell 1. In other words, the voltage electrode terminal 33 according to the disclosure includes the protrusion tension unit 34 bent frontward and protruding from the one lateral end, and the protrusion tension unit 34 is formed protruding further frontward than the current electrode terminal 35.

In a structure that the insulating plate 37 is directly stacked and mounted onto the voltage electrode terminal 33, the voltage electrode terminal 33 cannot come into electric contact with the electrode lead 5 of the pouch type battery cell 1. Therefore, the voltage electrode terminal 33 according to the disclosure includes the protrusion tension unit 34 bent frontward (i.e., in a stacking direction from the voltage electrode terminal 33 toward the current electrode terminal 35) and protruding from the one lateral end thereof. The protrusion tension unit 34 is bent frontward and protrudes from the one lateral end of the voltage electrode terminal 33, and therefore maintained as disposed protruding at one side of the current electrode terminal 35.

Meanwhile, both the voltage electrode terminal 33 and the current electrode terminal 35 according to the disclosure need to be disposed to come into contact with the electrode lead 5 of the pouch type battery cell 1. Therefore, the protrusion tension unit 34 according to the disclosure is formed to protrude further frontward than the current electrode terminal 35 as shown in FIG. 9.

When the electrode terminal assembly 30 with this structure elastically presses and supports the electrode lead 5 of the pouch type battery cell 1, the protrusion tension unit 34 protruding further frontward than the current electrode terminal 35 first comes into contact with the electrode lead 5 of the pouch type battery cell 1, and the tension and elasticity of the protrusion tension unit 34 allow the current electrode terminal 35 to then come into contact with the electrode lead 5 of the pouch type battery cell 1.

The protrusion tension unit 34 is bent frontward and protrudes from the one lateral end of the voltage electrode terminal 33, and thus basically has the tension and the elasticity. Therefore, the current electrode terminal 35 also elastically presses and supports the electrode lead 5 of the pouch type battery cell 1.

Although the protrusion tension unit 34 basically has the tension and the elasticity due to its bending shape, there is a need for reinforcing the tensional and elastic functions. To this end, the protrusion tension unit 34 according to the disclosure may be divided into a plurality of protrusion tension units 34 by cut portions 34a. Through the cut portions 34a, the protrusion tension units 34 are divided into a plurality of protrusion tension units 34. Ultimately, the tension and elasticity of each protrusion tension unit 34 may further be increased, thereby preventing the voltage electrode terminal 33 and the current electrode terminal 35 from the failure and error in contact with the electrode lead 5 of the pouch type battery cell 1.

The insulating plate 37 is interposed between the voltage electrode terminal 33 and the current electrode terminal 35 so that the voltage electrode terminal 33 and the current electrode terminal 35 stacked being overlapped with each other can be electrically insulated to prevent a short-circuit. The insulating plate 37 is made of an insulating material, overall shaped similarly to the voltage electrode terminal 33 and the current electrode terminal 35, and mounted to the electrode terminal mounting groove 32 to which the voltage electrode terminal 33 has already been mounted.

The current electrode terminal 35 is stacked on the insulating plate 37 mounted to the electrode terminal mounting groove 32. The current electrode terminal 35 may be disposed throughout the top area of the insulating plate 37, and thus have a sufficient contact area.

The current electrode terminal 35 may be formed with a plurality of contact protrusions on the contact area thereof as shown in FIG. 9. Further, the protrusion tension unit 34 provided in the voltage electrode terminal 33 may have a saw-toothed end. The contact protrusion and the saw-toothed end are formed in order to penetrate an oxide layer formed on the surface of the electrode lead 5 of the pouch type battery cell 1.

To perform the charging/discharging and the voltage measurement while the pouch type battery cell 1 is pressed, the voltage electrode terminal 33 needs to be connected to a voltage cable (not shown) and the current electrode terminal 35 needs to be connected to a current cable (not shown). To this end, the voltage electrode terminal 33 couples with a voltage cable lug 39a for connection with the voltage cable, and the current electrode terminal 35 couples with a current cable lug 39b for connection with the current cable.

The current cable lug 39b can be directly coupled to the current electrode terminal 35 because the current electrode terminal 35 is mounted to the outermost side of the electrode terminal assembly 30. On the other hand, the voltage cable lug 39a cannot be directly coupled to the voltage electrode terminal 33 because the voltage electrode terminal 33 is first mounted to and disposed at an inner side of the electrode terminal mounting groove 32.

To make the voltage cable lug 39a reach and couple with the voltage electrode terminal 33, the current electrode terminal 35 and the insulating plate 37 are formed with exposure portions serving as passages through which the voltage cable lug 39a is allowed to reach the voltage electrode terminal 33. In other words, the current electrode terminal 35 is formed with a first exposure portion 36, and the insulating plate 37 is formed with a second exposure portion 38 at a position corresponding to the first exposure portion 36. Therefore, the voltage cable lug 39a may couple with the voltage electrode terminal 33 through the first exposure portion 36 and the second exposure portion 38.

Meanwhile, as shown in FIG. 8, the electrode lead gripper 50 for the pressure activation device according to an embodiment of the disclosure may further include a spacer 40. The spacer 40 is interposed and coupled between the first side mounting plate 15 of the mounting frame 10 and the electrode terminal assembly 30.

The spacer 40 is employed and applied to change or adjust a protruding degree of the electrode terminal assembly 30 with respect to the mounting frame 10. The pouch type battery cell 1 according to the disclosure may have various capacities, and be varied in thickness depending on the capacities. According to the thickness of the pouch type battery cell 1, a distance between the electrode lead 5 of the pouch type battery cell 1 and the electrode terminal assembly 30 of the electrode lead gripper 50 mounted to the pressure plate 61 is also changed while the pouch type battery cell 1 is pressed by the pressure jigs 60.

To secure the contact between the electrode lead 5 and the electrode terminal assembly 30 while various pouch type battery cells 1 having various capacities are subjected to a pressure activation process, it is required to change or adjust the protruding degree (length) of the electrode terminal assembly 30. To this end, the electrode lead gripper 50 according to the disclosure includes the spacer 40 interposed and coupled between the first side mounting plate 15 and the electrode terminal assembly 30.

Meanwhile, as shown in FIGS. 5 to 8, the electrode lead gripper 50 for the pressure activation device according to an embodiment of the disclosure may further include the gripper guides 43 to be guided to slide by the gripper guide rails (see '89' in FIG. 10) provided in the foregoing pressure activation device. In other words, the gripper guides 43 are provided at the upper and lower sides of the mounting frame 10 according to the disclosure and guided to slide by the gripper guide rails 89 provided in the pressure activation device 100.

The gripper guide rails 89 are provided in the pressure activation device 100 as described above. In detail, the gripper guide rail 89 is disposed in the forward and backward directions (i.e., the pressing direction) of the main body 70 like the jig guide rail 87 provided in the main body 70. The electrode lead gripper 50 for the pressure activation device is mounted being put on the pressure plate 61, so that the gripper guide 43 can be guided being put on the gripper guide rail 89.

Therefore, when the pressure plates 61 are pressed in the pressing direction, the pressure plates 61 are pressed and moved as the jig guides (see '63' in FIG. 5) are guided to slide on the jig guide rails 87, and the electrode lead grippers 50 mounted to the pressure plates 61 are also moved in the pressing direction by the pressed and moved pressure plates 61 as the gripper guides 43 are guided to slide on the gripper guide rails 89. Therefore, the pressure plates 61 can stably slide without deviating from their mounting positions while being pressed to slide, thereby preventing failure and error in contact with the electrode lead 5 of the pouch type battery cell 1.

The gripper guide 43 may have various shapes as long as it has a structure for being guided to slide by the gripper guide rail 89. For example, as shown in FIG. 10, the gripper guide 43 may include a gripper guide hole 44 through which the gripper guide rail 89 can be disposed to pass. Similarly, the jig guide 63 may also include a jig guide hole 64, through which the jig guide rail 87 can be disposed to pass, as shown in FIG. 10. With this structure, when the pressure plate 61 is pressed, the pressure plate 61 can stably slide and move, and the electrode lead gripper 50 can also stably slide and move without breaking away.

Meanwhile, as shown in FIG. 10, the electrode lead gripper 50 for the pressure activation device according to an embodiment of the disclosure is movable in the lengthwise direction, i.e., the lateral direction of the pressure plate 61 (i.e., the direction where the electrode lead 5 of the pouch type battery cell 1 is disposed) while being mounted to the pressure plate 61, in order to cope with the pouch type battery cells 1 of various sizes. For this movement, the gripper guide rail 89 for guiding the gripper guide 63 may be driven to horizontally move in the lateral direction of the pressure plate 61.

In other words, the mounting frame 10 according to the disclosure is mounted movably in the lengthwise direction of the pressure plate 61 (i.e., the leftward and rightward directions (or the arrow directions) in FIG. 10), and adjusted in the position for being mounted to the pressure plate 61 as the gripper guide rail 89 is driven. Eventually, there is a great advantage in that the pressure activation processes for the pouch type battery cells 1 of various sizes are performed by only a simple operation in a single pressure activation device, without preparing the pressure activation devices respectively corresponding to the pouch type battery cells 1 of various sizes.

In more detail, as shown in FIG. 10, it may be impossible to immediately perform a new pressure activation process for the pouch type battery cell 1 mounted between the pressure plates 61 at the present mounting position of the electrode lead gripper 50. In other words, when a small pouch type battery cell 1 is mounted, the electrode lead 5 of the pouch type battery cell 1 may not be pressed and supported by the electrode lead grippers 50. For reference, the pouch type battery cell 1 according to the disclosure includes an electrode assembly 2 placed inside a pouch 3, and a pair of electrode leads (i.e., a positive electrode lead and a negative electrode lead) respectively protruding through both lateral sides of a pouch edge 4.

In the state shown in FIG. 10, the electrode lead grippers 50 respectively mounted to the opposite sides of the pressure plate 61 horizontally move inward, i.e., the direction where the pouch type battery cell 1 is mounted, and move up to the positions for pressing and supporting the pouch type battery cell 1. To this end, the gripper guide rail 89 inserted in and mounted to the gripper guide 43 of the electrode lead gripper 50 is driven for the horizontal inward movement. The movement of the gripper guide rail 89 in the horizontal direction (i.e., the lengthwise direction of the pressure plate 61) may be performed by the gripper guide rail driving unit (not shown) additionally provided in the pressure activation device 100.

To enable such an operation, the electrode lead gripper 50 for the pressure activation device according to the disclosure is not stationarily mounted to the pressure plate 61 but movably mounted being put on the pressure plate 61 without breaking away during the pressure sliding process. In other words, the mounting frame 10 is movably mounted being put on the pressure plate 61, and the gripper guide 43 is coupled being guided to slide on the gripper guide rail 89.

Because the mounting frame 10 is mounted movably along the lengthwise direction of the pressure plate 61, and the gripper guide rail 89 inserted in the gripper guide 43 is configured to be horizontally movable along the lengthwise direction of the pressure plate 61, it is possible to adjust the position where the mounting frame 10 is mounted to the pressure plate 61, thereby enabling the pressure activation process including the charging/discharging and the voltage measurement for the pouch type battery cells 1 of various sizes.

The aforementioned electrode lead gripper 50 for the pressure activation device according to an embodiment of the disclosure is provided in the pressure jig 60 as shown in FIG. 5. Specifically, the electrode lead grippers 50 for the pressure activation device according to an embodiment of the disclosure are mounted being put on the opposite sides of the pressure plate 61 of the pressure jig 60.

The pressure jig 60 according to the disclosure includes the electrode lead grippers 50 for the pressure activation device. As shown in FIG. 5, the pressure jig 60 including the electrode lead grippers for the pressure activation device according to an embodiment of the disclosure includes the pressure plate 61 for pressing the pouch type battery cell 1, and the electrode lead gripper 50 for the pressure activation device mounted to the pressure plate 61 and elastically clamping the electrode lead 5 of the pouch type battery cell 1 to be pressed by the pressure plate 61.

The foregoing configurations and operations are applied to the electrode lead gripper 50 for the pressure activation device. In other words, the electrode lead gripper 50 for the pressure activation device, which makes up the pressure jig 60, includes the mounting frame 10 mounted to the pressure plate 61 for pressing the pouch type battery cell 1, the supporting plate 20 coupled to the second side of the mounting frame 10 and supporting the electrode lead 5 of the pouch type battery cell 1 to be pressed, and the electrode terminal assembly 30 coupled to the first side of the mounting frame 10 and pressing and supporting the electrode lead 5 of the pouch type battery cell 1 to be pressed so that the pouch type battery cell 1 can be charged/discharged. In the state that the pouch type battery cell 1 is being pressed by the pair of adjacent pressure plates 61, the electrode lead 5 of the pouch type battery cell 1 is elastically pressed and supported between the electrode terminal assembly 30 coupled to the first side of the mounting frame 10 mounted to the pressure plate 61 and the supporting plate 20 coupled to the second side of the mounting frame 10 mounted to an adjacent pressure plate 61 disposed opposite to the foregoing pressure plate 61. The electrode terminal assembly 30 includes the electrode terminal base 31 made of an insulating material, and the voltage electrode terminal 33 and the current electrode terminal 35 sequentially mounted being overlapped onto the electrode terminal base 31 and stacked being electrically insulated from each other.

Specific configurations and operations other than the foregoing configurations and operations of the electrode lead gripper 50 for the pressure activation device are the same as described above, and thus repetitive descriptions will be avoided.

The pressure jig 60 including the electrode lead gripper for the pressure activation device according to an embodiment of the disclosure, as shown in FIG. 5, includes the pressure plate 61, and the foregoing electrode lead grippers 50 at the opposite sides of the pressure plate 61.

The pressure plate 61 performs an operation for pressing the pouch type battery cell 1 to be subjected to the pressure activation process, and further makes the pouch type battery cell 1 undergo the pressure activation process at a constant temperature. To this end, a heating pad 62 is attached to the first lateral side between the opposite lateral sides of the pressure plate 61.

Further, the pressure jig 60 according to the disclosure includes the jig guides 63 formed integrally with or detachably coupled to the opposite sides of the pressure plate 61. As described above, the jig guides 63 are guided by the jig guide rails 87 so that the pressure plate 61 can be stably pressed and moved sliding. The jig guide 63 is formed with the jig guide hole 64 through which the jig guide rail 87 can be disposed to pass.

Meanwhile, a cell entering guide 65 may be formed in an upper portion of the pressure plate 61. The pouch type battery cell 1 to be subjected to the pressure activation process by the pressure activation device 100 according to the disclosure enters from above the pressure plate 61 by Pick and Place. In this process, the cell entering guide 65 may guide the pouch type battery cell 1 to stably enter and be mounted between the pressure plates 61.

Although a few embodiments of the disclosure have been described above, it will be apparent for a person having ordinary knowledge in the art that these descriptions are for the illustrative purposes only and various changes can be made without departing from the scope of the disclosure. Accordingly, the genuine technical scope of the disclosure should be defined by the appended claims.

INDUSTRIAL APPLICABILITY

An electrode lead gripper for a pressure activation device according to the disclosure has industrial applicability because a current electrode terminal is configured to be stacked and mounted onto an electrode terminal base separately from a voltage electrode terminal and thus improved in contact reliability and increased in contact area in terms of contact with an electrode lead of a pouch type battery cell, thereby having advantages of decreasing contact resistance, reducing the amount of heat generated during charging/discharging, and resulting in further enhancing a charging/discharging efficiency.

The invention claimed is:

1. An electrode lead gripper for a pressure activation device, comprising:
   a mounting frame mounted to a pressure plate for pressing a pouch type battery cell;
   a supporting plate coupled to a second side of the mounting frame, and supporting an electrode lead of the pouch type battery cell to be pressed; and
   an electrode terminal assembly coupled to a first side of the mounting frame, said electrode terminal assembly pressing and supporting the electrode lead of the pouch type battery cell so that the pouch type battery cell can be charged/discharged, wherein, in a state that the pouch type battery cell is pressed by a pair of adjacent pressure plates, the electrode lead of the pouch type battery cell is elastically pressed and supported between the electrode terminal assembly coupled to the first side of the mounting frame mounted to the pressure plate and the supporting plate coupled to the second side of the mounting frame mounted to an adjacent pressure plate disposed opposite to the pressure plate, and
   wherein the electrode terminal assembly comprises an electrode terminal base made of an insulating material, and a voltage electrode terminal and a current electrode terminal sequentially mounted being overlapped onto the electrode terminal base and stacked being electrically insulated from each other.

2. The electrode lead gripper of claim 1, wherein the voltage electrode terminal, an insulating plate, and the current electrode terminal are stacked in sequence and mounted onto the electrode terminal base, the voltage electrode terminal comprises a protrusion tension unit bent frontward and protruding from one lateral end thereof, and the protrusion tension unit protrudes further frontward than the current electrode terminal.

3. The electrode lead gripper of claim 1, wherein the mounting frame comprises gripper guides at upper and lower sides thereof to be respectively guided to slide by gripper guide rails provided in the pressure activation device.

4. The electrode lead gripper of claim 3, wherein the mounting frame is mounted movably in a lengthwise direction of the pressure plate, and a position at which the mounting frame is mounted to the pressure plate is adjusted as the gripper guide rail is driven.

* * * * *